United States Patent [19]
Shou et al.

[11] Patent Number: 5,754,133
[45] Date of Patent: May 19, 1998

[54] REGISTER CIRCUIT HAVING A PLURALITY OF THRESHOLDING CIRCUITS

[75] Inventors: Guoliang Shou; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 513,657

[22] Filed: Aug. 11, 1995

[30] Foreign Application Priority Data

Aug. 12, 1994 [JP] Japan .................. 6-211875

[51] Int. Cl.[6] .................................. H03M 1/34
[52] U.S. Cl. .................. 341/158; 341/122; 341/172
[58] Field of Search ........................ 341/122, 123, 341/124, 125, 155, 156, 157, 158, 159, 160, 172

[56] References Cited

PUBLICATIONS

Higuchi et al., "Multiple–Valued Digital Processing System", Shokodo, pp. 50–55, 1989 (Figures translated).

Primary Examiner—Jeffrey A. Gaffin
Assistant Examiner—Jason H. Vick
Attorney, Agent, or Firm—Cushman, Darby & Cushman IP Group of Pillsbury Madison & Sutro LLP

[57] ABSTRACT

A register circuit for holding an analog input voltage includes a plurality of thresholding circuits of stepwise thresholds, an integrating circuit for integrating outputs of the thresholding circuits and a switching circuit for alternatively inputting an output of the integrating circuit or the analog input voltage to the thresholding circuits as the input voltage of the capacitive coupling.

16 Claims, 4 Drawing Sheets

5,754,133

REGISTER CIRCUIT HAVING A PLURALITY OF THRESHOLDING CIRCUITS

The present invention relates to a register circuit for holding input analog data with quantization.

BACKGROUND OF THE INVENTION

For holding analog data, the conventional digital computer converts input analog data to digital data using an A/D converter and then stores the data in a digital logic memory circuit.

However, there are problems in that a lot of electrical power is consumed because an A/D converter is a current-driven-type and that the circuit size is large.

SUMMARY OF THE INVENTION

The present invention is invented so as to solve the above problems and has an object to provide a register circuit with low electrical power consumption.

A register circuit according to the present invention, for achieving the mentioned object, has a quantization circuit for converting an analog input voltage to a multi-valued data by the predetermined quantizing pitch, and a switching circuit for alternatively switching an input to the quantization circuit or an output voltage from the quantization circuit. The quantization circuit is a parallel circuit of a plurality of thresholding circuits for adding an input voltage and reference voltage by capacitive couplings. The capacitive coupling of each thresholding circuit has at least one capacitor of different capacitance from the capacitance in the capacitive coupling in other thresholding circuit.

DETAILED DESCRIPTION OF THE PREFERRED EMBODIMENT

Figure 1:
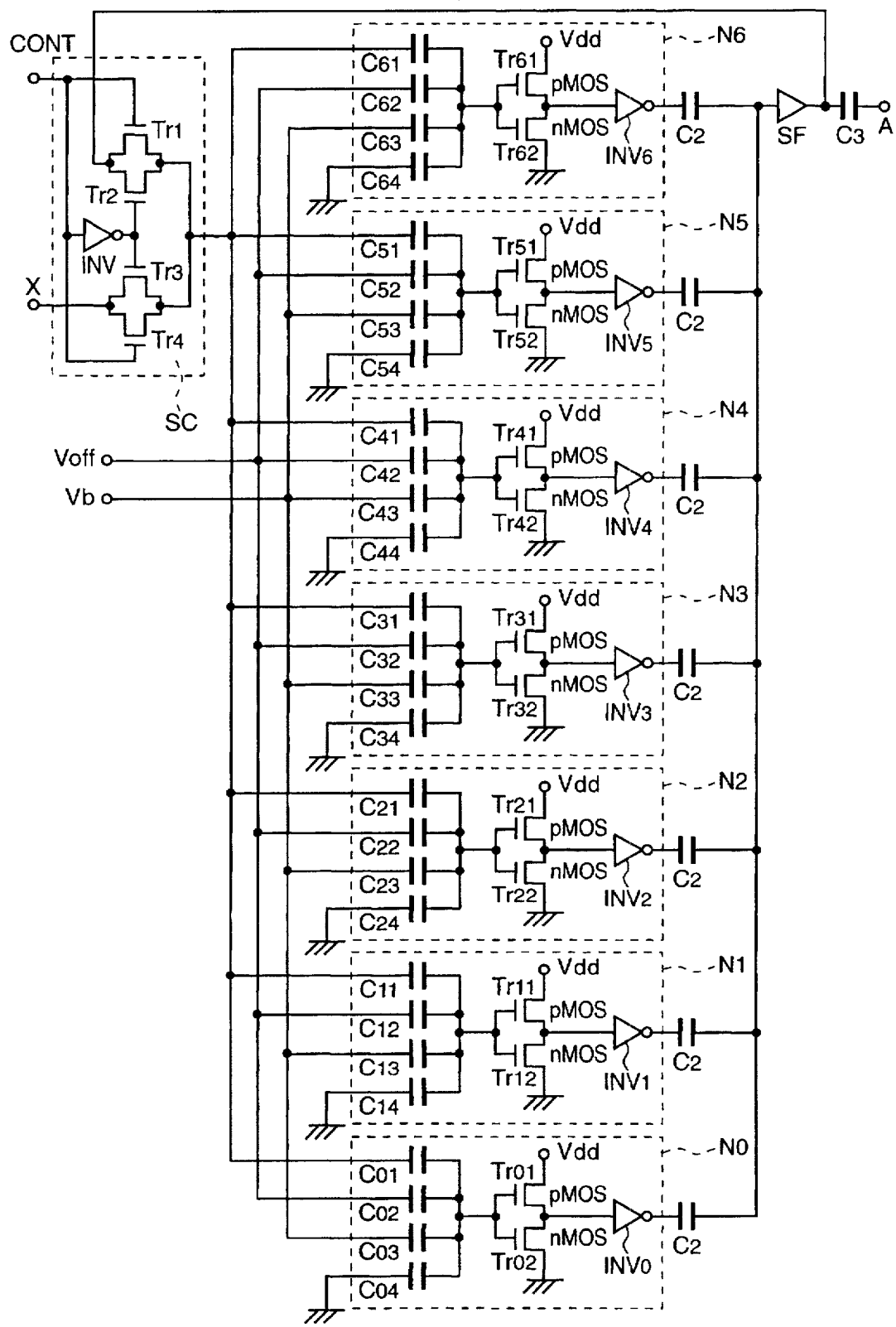
FIG. 1 is a circuit diagram showing the first embodiment of a register circuit according to the present invention.

Hereinafter an embodiment of a register circuit according to the present invention is described with referring to the attached drawings. FIG. 1 shows a register circuit of the first embodiment.

In FIG. 1, a register circuit of the first embodiment has a quantization circuit composed of seven thresholding circuits N0 to N6 connected in parallel. A switching circuit SC is connected to an input of the quantization circuit for alternatively switching an input to the quantizing circuit between an input voltage X and a feedback from an output of the quantization circuit.

Switching circuit SC includes a first switching element composed of pMOS type transistor Tr1 and nMOS type transistor Tr2, the second switching element composed of pMOS type transistor Tr3 and nMOS type transistor Tr4 and an inverter INV.

In the first switching element, the transistors Tr1 and Tr2 are connected at their sources with each other as well as at their drains with each other. An output of a quantization circuit is connected to the drains of the transistors in the first switching element. The output of the quantization circuit is fed back to the sources of the transistors in first switching circuit.

In the second switching element, the transistors Tr3 and Tr4 are connected at their sources with each other as well as at their drains with each other. The input signal X from the outside is connected to the drains of the transistors in the second switching element. The sources of the transistors are connected to the input of the quantization circuit.

A control signal CONT is directly input to the gates of transistors Tr1 and Tr4 and is input through an inverter INV to the gates of transistors Tr2 and Tr3. The inverter INV inverts the signal CONT.

When control signal CONT is low level, an output of the quantization circuit is fed back to the input of the quantization circuit because the first switching element is closed and the second switching element is opened. When CONT is high level, the input voltage X is input to the quantization circuit because the first switching element is opened and the second switching element is closed.

Each of the thresholding circuits N0 to N6 of the quantizing circuit has a capacitive coupling of four parallel capacitances. Two serial inverters are connected to an output of the capacitive coupling.

In the thresholding circuit N0, the capacitive coupling includes four capacitors C01, C02, C03 and C04 connected in parallel. The capacitor C01 of the capacitive coupling is connected to the output of the switching circuit SC. The input voltage X or the output of the quantization circuit is introduced through the switching circuit SC to the capacitor C01. The capacitor C02 is connected to an offset voltage Voff, the capacitor C03 is connected to a reference voltage Vb and the capacitor C04 is grounded. The output terminals of these capacitors are commonly input to the inverter of the first stage of the serial two MOS type inverters.

The first stage inverter includes two MOS transistors of pMOS type and nMOS type serially connected. A bias voltage Vdd is impressed to a source of pMOS type transistor Tr01 of the first stage, and its drain is connected to a drain of nMOS type transistor Tr02. Other thresholding circuits N1 to N6 have bias voltages Vdd equal to the bias voltage of N0 so that every thresholding circuit generates an output of equal voltage when the input voltage exceeds the threshold so that the thresholding circuits generate significant output, or fires. The gates of both transistors are commonly connected to the output of the capacitive coupling. The source of nMOS type transistor Tr02 is connected to ground, being kept to be the grounded voltage Vss. The output of the inverter of the first stage is input to an inverter INV0 of the second stage. Other thresholding circuits N1 to N6 are similar to N0, each of which has a capacitive coupling of 4 capacitors and inverters of 2 stages.

The thresholding circuit N0 to N6 have capacitors C01, C11, C21, C31, C41, C51 and C61 with equal capacitances, respectively, for receiving the input voltage X. The thresholding circuits N0 to N6 have capacitors C03, C13, C23, C33, C43, C53, and C63 with equal capacitances, respectively, for receiving the reference voltage Vb.

The thresholding circuits N0 to N6 have capacitors C02, C12, C22, C32, C42, C52 and C62, respectively, for receiving the offset voltage Voff. These capacitors are of stepwise capacitance values so that the thresholding circuits have stepwise thresholds. As the input voltage X increases, the thresholding circuits successively fire every time the input voltage exceeds the threshold of each of thresholding circuits. First N6 fires and the output of N6 changes from low level Vss to high level Vdd. Next N5 fires, and N4 to N0 fire one after another.

The grounded capacitors C04, C14, C24, C34, C44, C54 and C64 are determined to be of capacitances so as to keep the total capacitance of capacitive couplings in the thresholding circuits N0 to N6 constant. Here, the capacitors of all thresholding circuits are generalized to Ck1, Ck2, Ck3, Ck4 where k is 0 to 6 for the thresholding circuits N0 to N6. The capacitances of capacitors are defined as in the formulas (1) and (2) for giving the stepwise thresholds of N0 to N6.

formula (1): Ck1+Ck2+Ck3+Ck4=K

K: constant formula (2):

$$Vc = \frac{Ck1X + Ck2Voff + Ck3Vb}{Ck1 + Ck2 + Ck3 + Ck4}$$

Vc: threshold voltage of the thresholding circuit Nk

The threshold voltage Vc can be changed only by changing a capacitance of capacitor Ck3. When Ck3 is changed, both numerator and denominator of the formula (2) of the thresholding voltage changes. This causes difficulty in fine adjustment of the threshold voltage Vc. The grounded capacitor Ck4 is determined for compensating changes of Ck3 in the denominator of the formula (2), that is, (Ck3+Ck4) is kept constant. Then, Vc can be freely determined by adjusting Ck3 in the numerator of the formula (2) independently from the denominator.

Each of the thresholding circuits N1 to N6 is connected to a capacitor C2 equal in capacitance for each circuits N0 to N6. These capacitors C2 are commonly connected to a source follower SF. The capacitors C2 have a function of a capacitive coupling for calculating the total of the outputs of the thresholding circuits N0 to N6. An output of source follower SF is fed back to the switching circuit SC and connected to a capacitor C3 through which an output of the register circuit is output as a quantized output of the input voltage X.

Figure 2:
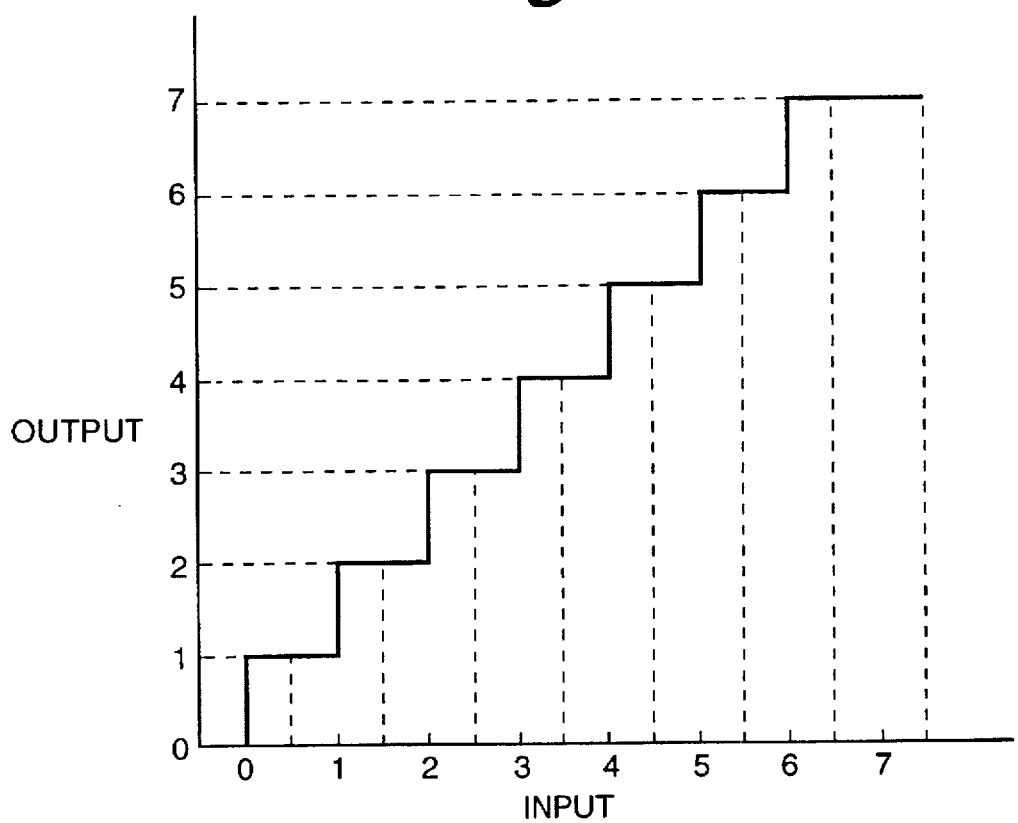
FIG. 2 is a graph showing a relationship input and quantized output.

As shown in the following Table 1 and in FIG. 2, the register circuit performs quantization.

TABLE 1

| Input Voltage X (V) | Multi-Value | Output | Multi-Value |
|---|---|---|---|
| X ≧ 13Vdd/16 | 7 | 7Vdd/8 | 7 |
| 13Vdd/16 > X ≧ 11Vdd/16 | 6 | 6Vdd/8 | 6 |
| 11Vdd/16 > X ≧ 9Vdd/16 | 5 | 5Vdd/8 | 5 |
| 9Vdd/16 > X ≧ 7Vdd/16 | 4 | 4Vdd/8 | 4 |
| 7Vdd/16 > X ≧ 5Vdd/16 | 3 | 3Vdd/8 | 3 |
| 5Vdd/16 > X ≧ 3Vdd/16 | 2 | 2Vdd/8 | 2 |
| 3Vdd/16 > X ≧ Vdd/16 | 1 | 1Vdd/8 | 1 |
| Vdd/16 > X ≧ 0 | 0 | 0Vdd8 | 0 |

When the control signal CONT is high level, the input voltage X, offset voltage Voff, reference voltage Vb are impressed to each thresholding circuit N0 to N6. When the input voltage is larger than Vdd/16, thresholding circuit N6 fires. Thereafter, each time input voltage X rises by Vdd/8, thresholding circuits N5 to N0 successively fire.

The firing thresholding circuit outputs the voltage of Vdd. When a number of firing threshold circuits is n and electrostatic capacitance of capacitors C2 is C2, the integrated output of 8 capacitors C2 is defined as (n·C2·Vdd)/(8·C2). A value of C2 is common, so the output voltage is n·Vdd/8.

In Table 1, the input voltage X is divided into 8 levels of 0 to Vdd/16, Vdd/16 to 3Vdd/16, 3Vdd/16 to 5Vdd/16, 5Vdd/16 to 7Vdd/16, 7Vdd/16 to 9Vdd/16, 9Vdd/16 to 11Vdd/16, 11Vdd/16 to 13Vdd/16 and 13Vdd/16 to Vdd. These levels are assigned to 8 levels multi-values of 0, 1, 2, 3, 4, 5, 6 and 7. The output A of the register circuit is 0, Vdd/8, Vdd/4, 3Vdd/8, Vdd/2, 5Vdd/8, 3Vdd/4, 7Vdd/8 corresponding to the multi-values 0, 1, 2, 3, 4, 5, 6 and 7, respectively. As a result, the input voltage is divided into 8 values of predetermined distance and quantization is realized.

The register circuit performs data holding when the control signal is switched to a low level. The switching circuit is switched to introduce the feedback voltage of the quantization circuit. The input voltage X is removed. The feedback voltage has a quantized value of the input voltage X which is input before the CONT is changed to be low. And the feedback voltage as an input to the quantization circuit causes the same output to the output by X. Therefore, the register circuit recurrently generates the output corresponding to the input voltage X just before the switching circuit is switched to the feedback voltage. If a small voltage drop occurs within the register circuit, the quantization circuit increases the feedback voltage up to the predetermined quantized level higher than the current feedback voltage. Then the voltage drop is compensated and the voltage can be held without change for a long time.

In the embodiment above, there are seven thresholding circuits and grounded capacitors for generating 8 levels multi-values. Multi-values of more levels can be generated by adding more thresholding circuits, and it is also possible to decrease the number of thresholding circuits for less levels of multi-values.

The capacitances of capacitors C2 connected to the output of the thresholding circuit are equal to one another so that the quantization pitch is constant. However, it is possible to define different quantization pitches by changing capacitances of C2.

Figure 3:
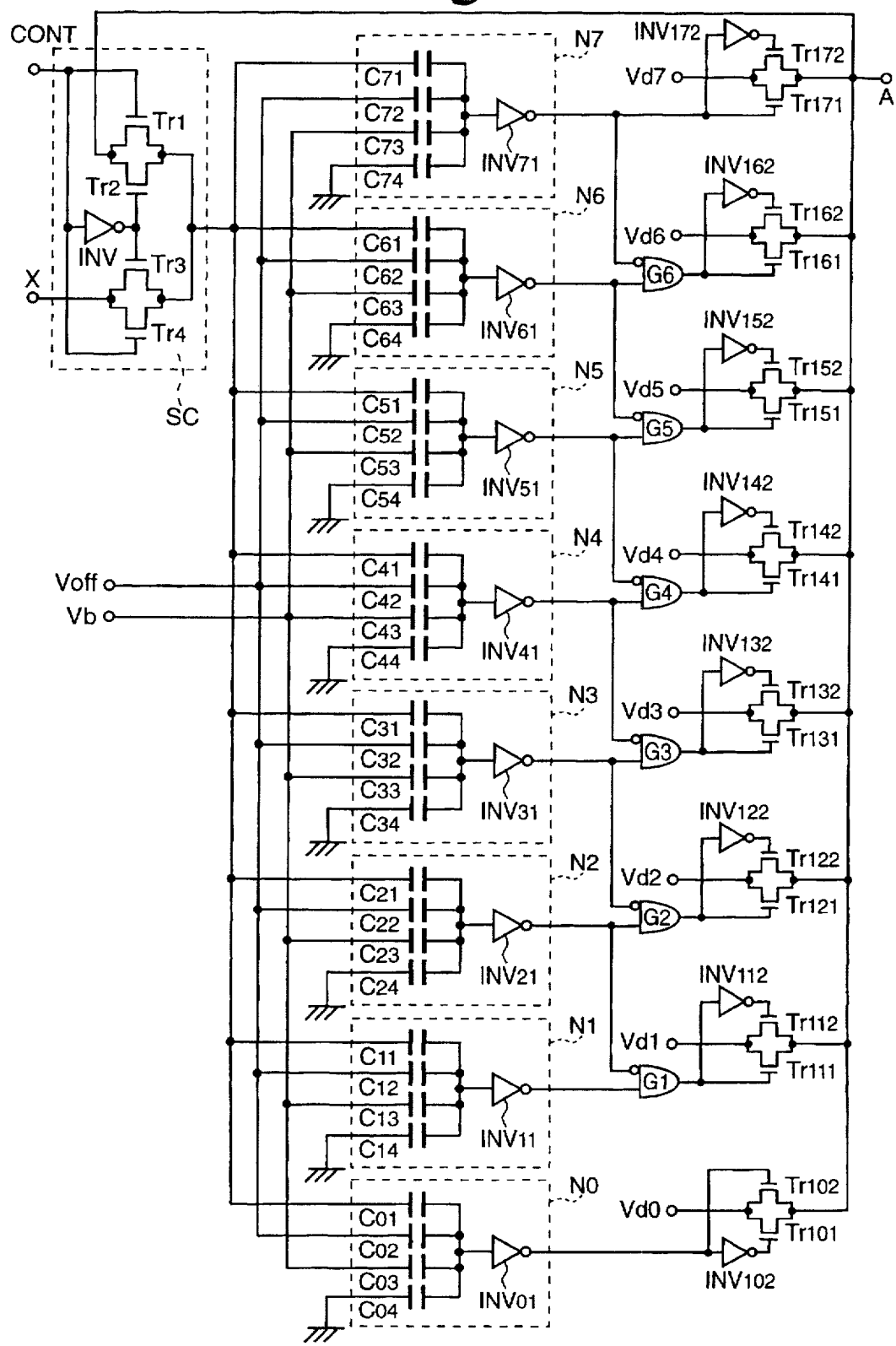
FIG. 3 is a circuit diagram showing the second embodiment of a register circuit.

Hereinafter an embodiment of a register circuit according to the present invention is described with reference to the attached drawings. FIG. 3 shows a register circuit of the second embodiment.

In FIG. 3, a register circuit of the first embodiment has a quantization circuit composed of eight thresholding circuits N0 to N7 connected in parallel. A switching circuit SC is connected to an input of the quantization circuit for alternatively switching an input to the quantizing circuit between an input voltage X and a feedback from an output of the quantization circuit.

Switching circuit SC includes the first switching element composed of pMOS type transistor Tr1 and nMOS type transistor Tr2, the second switching element composed of pMOS type transistor Tr3 and nMOS type transistor Tr4 and an inverter INV.

In the first switching element, the transistors Tr1 and Tr2 are connected at their sources with each other as well as at their drains with each other. An output of a quantization circuit is connected to the drains of the transistors in the first switching element. The output of the register circuit is fed back to the sources of the transistors in first switching circuit.

In the second switching element, the transistors Tr3 and Tr4 are connected at their sources with each other as well as at their drains with each other. The input signal X from the outside is connected to the drains of the transistors in the second switching element. The sources of the transistors are connected to the input of the quantization circuit.

A control signal CONT is directly input to the gates of transistors Tr1 and Tr4 and is input through an inverter INV to the gates of transistors Tr2 and Tr3. The inverter INV inverts the signal CONT.

When control signal CONT is low level, an output of the register circuit is fed back to the input of the quantization circuit because the first switching element is closed and the second switching element is opened. When CONT is high level, the input voltage X is input to the quantization circuit because the first switching element is opened and the second switching element is closed.

Each of the thresholding circuits N0 to N7 of the quantizing circuit has a capacitive coupling of four parallel capacitors. An inverter INV01 is connected to an output of the capacitive coupling.

In the thresholding circuit N0, the capacitive coupling includes four capacitors C01, C02, C03 and C04 connected in parallel. The capacitor C01 of the capacitive coupling is connected to the output of the switching circuit SC. The input voltage X or the output of the quantization circuit is introduced through the switching circuit SC to the capacitor C01. The capacitor C02 is connected to an offset voltage Voff, the capacitor C03 is connected to a reference voltage Vb and the capacitor C04 is grounded. The output terminals of these capacitors are commonly input to the inverter INV0 of MOS type inverter.

The thresholding circuit N0 to N7 have capacitors C01, C11, C21, C31, C41, C51, C61 and C71 with equal capacitances, respectively, for receiving the input voltage X. The thresholding circuits N0 to N7 have capacitors C03, C13, C23, C33, C43, C53, C63 and C73 with equal capacitances, respectively, for receiving the reference voltage Vb.

The thresholding circuits N0 to N7 have capacitors C02, C12, C22, C32, C42, C52, C62 and C72, respectively, for receiving the offset voltage Voff. These capacitors are of stepwise capacitances so that the thresholding circuits have stepwise thresholds. As the input voltage X increases, the thresholding circuits successively fire every time the input voltage exceeds the threshold of each of thresholding circuit. First N7 fires and the output of N7 changes from low level Vss to high level Vdd. Next N6 fires, and N5 to N0 fire one after another.

The thresholding circuit N0 with the highest threshold voltage is connected at an output to the second switching circuit which includes a NMOS type transistor Tr1O1, a pMOS type transistor Tr1O2 and an inverter INV102 similar to the first switching element of the first switching circuit SC. When an output of thresholding Circuit N0 is a high level (non-firing condition), the second switching circuit is opened and its output is high impedance. When the thresholding circuit N0 fires and its output becomes a low level, the switching circuit is closed. A voltage VdO is connected to the second switching circuit so that this voltage VdO is output when the switching circuit is closed.

The thresholding circuit N7 with the lowest threshold voltage is connected at an output to the second switching circuit which includes a nMOS type transistor Tr171, a pMOS type transistor Tr172 and an inverter INV172 similar to the first switching element of the first switching circuit SC. When an output of thresholding circuit N7 is a high level (non-firing condition), the second switching circuit is opened and its output is high impedance. When the thresholding circuit N7 fires and its output becomes a low level, the switching circuit is closed. A voltage Vd7 is connected to the second switching circuit so that this voltage Vd7 is output when the switching circuit is closed.

Other thresholding circuits N1 to N6 are connected to gate circuits G1 to G6, respectively, each gate circuit generates a high level output when an adjacent thresholding circuit of lower threshold fires and the corresponding thresholding circuit does not fire. The gate circuits are AND gate each of which receives an output of adjacent thresholding circuit of lower threshold as an inverted input and an output of the corresponding thresholding circuit as a non-inverted input. The second switching circuits, similar to the switching circuit of N0 and N7, are connected to outputs of the gate circuits to which predetermined voltages Vd1 to Vd6 are connected.

The output of thresholding circuit N7 is invertedly input to the gate circuit G6 of thresholding circuit N6 of a threshold voltage higher than that of N7. The gate circuit G6 outputs a low level voltage as long as the thresholding circuit N7 does not fires. The gate G6 can output a high level voltage only when the thresholding circuit N7 outputs a high level voltage in the non-firing condition. A voltage Vd6 is connected to the second switching circuit connected to G6 so that Vd6 is output from the second switching circuit when it is closed by the high output from G6. The second switching circuit outputs high impedance when the switching circuit is opened by the low output from G6.

Each of the AND gates G1 to G6 outputs a high level only when the adjacent lower thresholding circuit fires as well as the corresponding thresholding circuit does not fires, that is, the input voltage is between the lower thresholding circuit and the corresponding circuit. As a result, only one voltage connected to the second switching circuit is output when the input voltage exceeds the threshold of the corresponding thresholding circuit and does not reach the threshold of the next thresholding circuit of higher threshold.

TABLE 2

| Input Voltage X (V) | Multi-Value | Output | Multi-Value |
|---|---|---|---|
| X ≧ 13Vdd/16 | 7 | Vdd0 | 7 |
| 13Vdd/16 > X ≧ 11Vdd/16 | 6 | Vdd1 | 6 |
| 11Vdd/16 > X ≧ 9Vdd/16 | 5 | Vdd2 | 5 |
| 9Vdd/16 > X ≧ 7Vdd/16 | 4 | Vdd3 | 4 |
| 7Vdd/16 > X ≧ 5Vdd/16 | 3 | Vdd4 | 3 |
| 5Vdd/16 > X ≧ 3Vdd/16 | 2 | Vdd5 | 2 |
| 3Vdd/16 > X ≧ Vdd/16 | 1 | Vdd6 | 1 |
| Vdd/16 > X ≧ 0 | 0 | Vdd7 | 0 |

The second embodiment of a register circuit is described with referring to Table 2. When control signal CONT is a high level, and input voltage X, offset voltage Voff and reference voltage Vb are impressed to each thresholding circuit N0 to N7. When the input voltage is smaller than Vdd/16, then all thresholding circuits do not fire and their outputs are a high level. Then the switching circuit connected to thresholding circuit N7 is ON, and the output voltage is Vd7 because other switching circuits are OFF.

When X is less than 3Vdd/16 and equal to or more than Vdd/16, only the thresholding circuit N7 fires. Switching circuit connected thresholding circuit N7 is OFF. Switching circuit is ON when output of gate circuit G6 is high level. Other switching circuits are OFF, then output voltage is Vd6. Each time input voltage X increases by Vdd/8, thresholding circuits N6 to N0 successively fire. When X is less than 5Vdd/16 and equal to or more than 3Vdd/16, the thresholding circuits N7 and N6 fire. Firing of N6 makes the output of gate circuit G6 low level and switching circuit OFF, then the output of the gate circuit G5 becomes high level so that the voltage Vd5 of the switching circuit become the final output voltage A. When the input voltage is more than 13Vdd/16, all thresholding circuits fire. And all gates circuits G1 to G6 become low level and all switching circuits of threshold values N1 to N7 are OFF. Only switching circuit of thresholding circuit N0 is ON and output voltage Vd0 is output as the final output voltage A of the register circuit.

In this embodiment, input voltage X(Vdd/16 to 13Vdd/16) is divided into multi-values 0 to 7, and the output voltage A (0 to 7Vdd/8) corresponds to multi-values 0 to 7. As a result, input with a predetermined range steps is divided into 8 values, and quantization is realized.

Similar to the first embodiment, the circuit of the second embodiment has a function as a register circuit for holding quantized voltage when the first switching circuit is switched to the feed back voltage of the register circuit.

Figure 4:
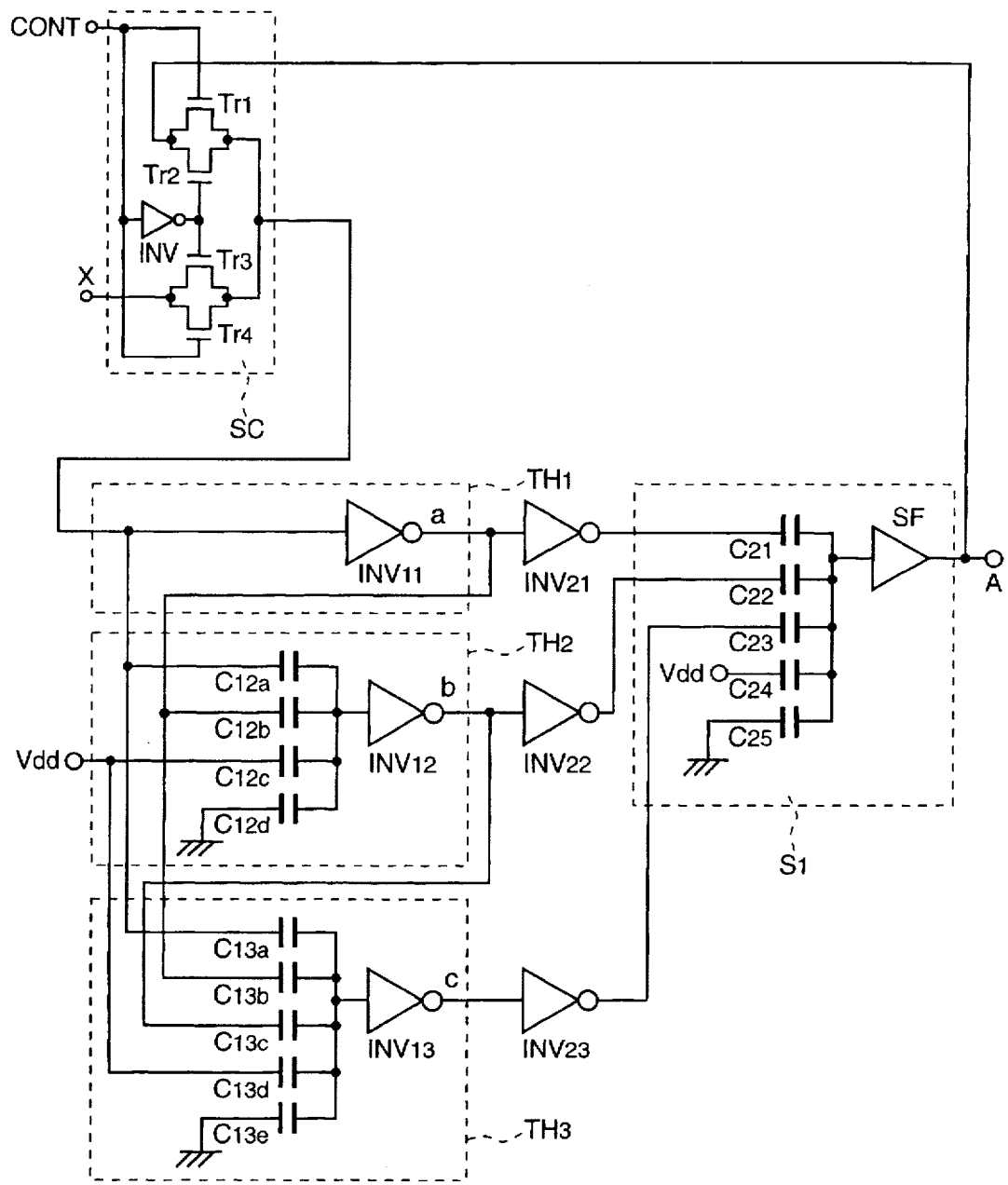
FIG. 4 is a circuit diagram showing the third embodiment.

FIG. 4 is a circuit diagram showing the third embodiment of a register circuit of the present invention. The circuit has 3 thresholding circuits TH1, TH2 and TH3 connected in parallel to the first switching circuit SC for changing the final output from high to low or low to high when input X reaches multi-values 1, 2 and 4. Inverters INV21, INV22 and INV23 are connected to the thresholding circuits TH1, TH2 and TH3, respectively, for inverting the outputs of the inverter. A summing circuit S1 is provided for calculating a weighted summation of outputs of these inverters. The switching circuit SC is similar to that in the first embodiment.

Concerning the third embodiment of a quantizing circuit, the relationship between the analog input voltage X and quantized multi-valued data is shown in Table 3, where the voltage of electrical source is shown by Vdd.

TABLE 3

| Input Voltage | Multi-Values |
| --- | --- |
| 0 ≦ X < Vdd/8 | 0 |
| Vdd/8 ≦ X < 2Vdd/8 | 1 |
| 2Vdd/8 ≦ X < 3Vdd/8 | 2 |
| 3Vdd/8 ≦ X < 4Vdd/8 | 3 |
| 4Vdd/8 ≦ X < 5Vdd/8 | 4 |
| 5Vdd/8 ≦ X < 6Vdd/8 | 5 |
| 6Vdd/8 ≦ X < 7Vdd/8 | 6 |
| 7Vdd/8 ≦ X | 7 |

Each thresholding circuit TH1, TH2 and TH3 correspond to bit of 4, 2 and 1 of binary number, and TH2 and TH3 receives an output of thresholding circuits of higher thresholds together with the output of SC. The thresholding circuits TH2 and TH3 have capacitive couplings for weighting input voltages so that the output of the thresholding circuits repeatedly changes from low to high and high to low.

Thresholding circuit TH1 includes an inverter INV11. A threshold value of the inverter is Vdd/2 and fires when an input value is equal to a level of multi-value 4 corresponding to Vdd/2. The output of the thresholding circuit is designated as 'a'.

The thresholding circuit TH2 has a capacitive coupling of capacitors C12$a$, C12$b$, C12$c$ and C12$d$ connected to the output of SC, output 'a' of TH1, Vdd and the ground, respectively. These capacitors have capacitances in a proportion of 4:2:1:1. An inverter INV12 is connected to the capacitive coupling for inverting the output of the capacitive coupling so as to generate an output 'b'.

The thresholding circuit TH3 has a capacitive coupling of capacitors C13$a$, C13$b$, C13$c$, C13$d$ and C13$e$ connected to the output of SC, an output 'a' of TH1, output 'b' of TH2, Vdd and the ground, respectively. These capacitors have capacitances in a proportion of 8:4:2:1:1. An inverter INV 13 is connected to the capacitive coupling for inverting the output of the capacitive coupling so as to generate an output 'c'.

If the electrostatic capacitance of each capacitor is Ci and an input voltage corresponding to each capacitor is Vi, then voltage Vout performed capacitive coupling by a capacitance in thresholding circuit is shown in formula (3).

$$V_{out} = (\Sigma Ci \times Vi)/(\Sigma Ci) \ldots \quad (3)$$

Threshold values of inverters INV11 to INV13 are common, Vdd/2. Thresholding circuits TH2 and TH3 fire and change the output to be inverted, when the output voltage Vout in the formula (3) exceeds Vdd/2.

Outputs of each thresholding circuit corresponding to analog input voltage X is shown in Table 4. Voltage is shown by multipliers to be multiplied to Vdd. Vout 12 and Vout 13 show a result, after calculating the voltage of capacitive coupling before each thresholding circuit is inverted in formula (3). Inverting and non-inverting of inverter outputs Vdd when Vout 12 and Vout 13 are smaller than Vdd/2 and outputs 0 when the values are larger than Vdd/2.

TABLE 4

| Thresholding Circuit TH1 | | | | | | | | |
| --- | --- | --- | --- | --- | --- | --- | --- | --- |
| Input Voltage | 0 | 1/8 | 2/8 | 3/8 | 4/8 | 5/8 | 6/8 | 7/8 | 8/8 |
| Output "a" | 1 | 1 | 1 | 1 | 0 | 0 | 0 | 0 | |
| Thresholding Circuit TH2 | | | | | | | | | |
| Input VoltageXx4 | 0 | 0.5 | 1 | 1.5 | 2 | 2.5 | 3 | 3.5 | 4 |
| Output "a"x2 | 2 | 2 | 2 | 2 | 2 | 0 | 0 | 0 | 0 |
| Vdd | 1 | 1 | 1 | 1 | 1 | 1 | 1 | 1 | 1 |
| Vout12 | 3/8 | 3.5/8 | 4/8 | 4.5/8 | 5/8 | 3.5/8 | 4/8 | 4.5/8 | 5/8 |
| Output "b" | 1 | 1 | 0 | 0 | 1 | 1 | 0 | 0 | |
| Thresholding Circuit TH3 | | | | | | | | | |
| Input VoltageXx8 | 0 | 1 | 2 | 3 | 4 | 5 | 6 | 7 | 8 |
| Output "a"x4 | 4 | 4 | 4 | 4 | 4 | 0 | 0 | 0 | 0 |
| Output "b"x2 | 2 | 2 | 2 | 0 | 0 | 2 | 2 | 0 | 0 |
| Vdd | 1 | 1 | 1 | 1 | 1 | 1 | 1 | 1 | 1 |
| Vout13 | 7/16 | 8/16 | 9/16 | 8/16 | 9/16 | 8/16 | 9/16 | 8/16 | 9/16 |
| Output "c" | 1 | 0 | 1 | 0 | 1 | 0 | 1 | 0 | |

Summing circuit S1 is connected through inverters INV21, INV22 and INV23 to the thresholding circuits TH1, TH2 and TH3, respectively. The summing circuit includes a capacitive coupling of capacitors C21, C22, C23, C24 and C25 connected in parallel, and a source follower SF. Outputs a, b and c of each thresholding circuit TH1, TH2 and TH3 are invertedly input to capacitors C21, C22 and C23, respectively. The source voltage Vdd is input to the capacitor C24 and capacitor C25 is grounded.

Capacitances of capacitors C21, C22, C23, C24 and C25 are determined as 8:4:2:1:1 for giving weight of 4:2:1 to the outputs of thresholding circuits TH1, TH and TH3. The source follower SF has a function for stabilizing an output of summing circuit S1 when impedance of output side is infinity.

The weighted outputs of thresholding circuits are shown in Table 5. The relation between input voltage X and output of summing circuit S1 is also shown. The output voltage A is an octal quantized signal corresponding to input voltage X.

TABLE 5

Thresholding Circuit TH3

| Input VoltageX | 0 | 1/8 | 2/8 | 3/8 | 4/8 | 5/8 | 6/8 | 7/8 | 1 |
|---|---|---|---|---|---|---|---|---|---|
| Output of INV21x8 | 0 | 0 | 0 | 0 | 8 | 8 | 8 | 8 | |
| Output of INV22x4 | 0 | 0 | 4 | 4 | 0 | 0 | 4 | 4 | |
| Output of INV23x2 | 0 | 2 | 0 | 2 | 0 | 2 | 0 | 2 | |
| Source Voltage Vdd | 1 | 1 | 1 | 1 | 1 | 1 | 1 | 1 | |
| Output "A" of Summing Circuit S1 | 1/16 | 3/16 | 5/16 | 7/16 | 9/16 | 11/16 | 13/16 | 15/16 | |
| Multi-Value | 0 | 1 | 2 | 3 | 4 | 5 | 6 | 7 | |

As the output of the summing circuit S1, the quantization boundary such as Vdd/8 and 2Vdd/8 may be applied, however, a confusion possibility occurs between quantized value of 4 and 5 when an output voltage is 5Vdd/8 and some noise is included. In the present embodiment, the middle level between boundary voltages is used. Output is arranged as in the Table 3. There is little possibility to misjudge of quantized multi-values even though a little fluctuation is included in the voltage.

A circuit of the third embodiment has a function as a circuit for keeping a quantified signal by switching the switching circuit into the feedback side.

What is claimed is:

1. A register circuit for holding an analog input voltage comprising:

a plurality of thresholding circuits of stepwise thresholds;

an integrating circuit for integrating outputs of said thresholding circuits; and a switching circuit for alternatively inputting an output of said integrating circuit or said analog input voltage to said thresholding circuits as said input voltage of said thresholding circuits.

2. A register circuit as claimed in claim 1, wherein each said thresholding circuit comprises:

a capacitive coupling connected with an input voltage and a reference voltage for weighting said voltages; and an inverter with a predetermined threshold which is connected to an output of said capacitive coupling for outputting a low voltage when said output is equal to or more than said threshold.

3. A register circuit as claimed in claim 2, wherein said integrating circuit comprising the second capacitive coupling for adding said outputs of said thresholding circuit.

4. A register circuit as claimed in claim 2, wherein said integrating circuit comprising:

a plurality of second switching circuits corresponding to said thresholding circuits and connected to predetermined voltages corresponding to said thresholding circuits, said second switching circuits passes said predetermined voltages when closed, outputs of said second switching circuits being connected to a common output terminal; and a plurality of gate circuits corresponding to other of said thresholding circuits than said thresholding circuit with maximal and minimal thresholds each for closing corresponding second switching circuit of said second switching circuit only when corresponding thresholding circuit fires as well as adjacent thresholding circuit of lower threshold fires.

5. A register circuit as claimed in claim 4, wherein said gate circuit comprises an AND gate to which one said outputs of said adjacent thresholding circuit and of said corresponding thresholding circuit is inverted.

6. A register circuit as claimed in claim 4, wherein said second switching circuit comprises a MOS switch.

7. A register circuit as claimed in claim 2, wherein said capacitive couplings further receiving an offset voltage common to all said thresholding circuits.

8. A register circuit as claimed in claim 2, wherein said capacitive couplings further receive a ground voltage.

9. A register circuit as claimed in claim 2, wherein said thresholding circuits further comprising the second inverters for inverting outputs of said inverters.

10. A register circuit as claimed in claim 2, further comprising a source follower connected between said integrating circuit and said switching circuit.

11. A register circuit as claimed in claim 10, further comprising a capacitance connected between said source follower and said switching circuit.

12. A register circuit as claimed in claim 2, said switching circuit comprising:

the first MOS switch for receiving said analog input voltage;

the second MOS switch for receiving said output of said integrating circuit; and an inverter for inverting a control signal, which is provided for opening and closing of said first and second MOS switches, for one of said MOS switch so that said MOS switches are alternatively closed.

13. A register circuit as claimed in claim 1, wherein each said thresholding circuits comprises an inverter with a predetermined threshold and each of other said thresholding circuits than said thresholding circuit of the highest threshold further comprises capacitive coupling for receiving said analog input voltage, a reference voltage and an output of adjacent thresholding circuit of higher threshold.

14. A register circuit as claimed in claim 13, wherein said integrating circuit comprises:

the second inverters each connected to one of said thresholding circuit; and an addition circuit for adding outputs of said inverters.

15. A quantization circuit for quantizing an analog input voltage into multi-valued voltage comprising:

a plurality of thresholding circuits of stepwise thresholds; and an integrating circuit for integrating outputs of said thresholding circuits;

wherein each said thresholding circuit comprises:

a capacitive coupling connected with an input voltage and a reference voltage for weighting said voltages; and an inverter with a predetermined threshold and connected to an output of said capacitive coupling for outputting a low voltage when said output is equal to or more than said threshold.

16. A quantization circuit for quantizing an analog input voltage into multi-valued voltage, comprising:

a plurality of thresholding circuits of stepwise thresholds; and an integrating circuit for integrating outputs of said thresholding circuits;

wherein each said thresholding circuits comprises an inverter with a predetermined threshold and each of other said thresholding circuits than said thresholding circuit of the highest threshold further comprises capacitive coupling for receiving said analog input voltage, a reference voltage and an output of adjacent thresholding circuit of higher threshold.

* * * * *